(12) United States Patent
Wei

(10) Patent No.: US 7,372,295 B1
(45) Date of Patent: May 13, 2008

(54) TECHNIQUES FOR CALIBRATING ON-CHIP TERMINATION IMPEDANCES

(75) Inventor: Kwong-Wen Wei, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/615,579

(22) Filed: Dec. 22, 2006

(51) Int. Cl.
*H03K 19/003* (2006.01)

(52) U.S. Cl. .............................. 326/30; 326/27; 326/83

(58) Field of Classification Search ................ 326/26, 326/27, 30, 82–86
See application file for complete search history.

(56) References Cited

U.S. PATENT DOCUMENTS

| | | | |
|---|---|---|---|
| 5,559,448 A | | 9/1996 | Koenig |
| 5,926,031 A | * | 7/1999 | Wallace et al. ................ 326/30 |
| 5,955,911 A | | 9/1999 | Drost et al. |
| 6,064,224 A | | 5/2000 | Esch et al. |
| 6,118,310 A | | 9/2000 | Esch et al. |
| 6,288,564 B1 | * | 9/2001 | Hedberg ....................... 326/30 |
| 6,445,245 B1 | | 9/2002 | Schultz et al. |
| 6,525,558 B2 | * | 2/2003 | Kim et al. ..................... 326/30 |
| 6,573,746 B2 | * | 6/2003 | Kim et al. ..................... 326/30 |
| 6,586,964 B1 | | 7/2003 | Kent et al. |
| 6,590,413 B1 | | 7/2003 | Yang |
| 6,603,329 B1 | | 8/2003 | Wang et al. |
| 6,661,250 B2 | * | 12/2003 | Kim et al. ..................... 326/30 |
| 6,812,732 B1 | | 11/2004 | Bui et al. |
| 6,836,144 B1 | | 12/2004 | Bui et al. |
| 6,888,369 B1 | | 5/2005 | Wang et al. |
| 6,888,370 B1 | | 5/2005 | Luo et al. |
| 6,980,020 B2 | * | 12/2005 | Best et al. ..................... 326/30 |
| 7,221,193 B1 | * | 5/2007 | Wang et al. ................ 327/108 |
| 2006/0071683 A1 | * | 4/2006 | Best et al. ..................... 326/30 |
| 2008/0001624 A1 | * | 1/2008 | Lee .............................. 326/30 |

OTHER PUBLICATIONS

U.S. Appl. No. 11/040,343, filed Jan. 20, 2005, Chang et al.
U.S. Appl. No. 11/040,048, filed Jan. 20, 2005, Wang et al.
U.S. Appl. No. 11/381,356, filed May 02, 2006, Wang et al.

\* cited by examiner

*Primary Examiner*—Don Le
(74) *Attorney, Agent, or Firm*—Steven J. Cahill

(57) ABSTRACT

A calibration circuit block includes a first resistor network, a second resistor network, and a feedback loop. The first resistor network includes a set of transistors and receives a constant current from a constant current source. The second resistor network receives a tracking current from a tracking current source. The impedance of the second resistor network changes with temperature and process variations on the integrated circuit. The tracking current source compensates for variations in the impedance of the second resistor network that are caused by process and temperature variations to maintain a constant reference voltage at the second resistor network. The feedback loop generates calibration control signals for controlling the conductive states of the transistors in the first resistor network. The feedback loop adjusts the calibration control signals to maintain a constant impedance in the first resistor network.

20 Claims, 7 Drawing Sheets

TECHNIQUES FOR CALIBRATING ON-CHIP TERMINATION IMPEDANCES

BACKGROUND OF THE INVENTION

The present invention relates to electronic circuits, and more particularly, to techniques for calibrating on-chip termination impedances for transmitters and receivers to terminate transmission lines.

Signal reflection can occur on transmission lines when there is a mismatch between the characteristic impedance of the transmission line and the impedance of the transmitter and/or receiver. The reflected signal can interfere with the transmitted signal, causing distortion and degrading signal integrity.

To solve this problem, transmission lines are resistively terminated by a matching impedance to minimize or eliminate signal reflection. Input/output (I/O) pins on an integrated circuit package can be terminated by coupling external termination resistors to the appropriate I/O pins. However, many integrated circuit packages require a large number of termination resistors, because they have a large number of I/O pins. Therefore, it is becoming more common to resistively terminate transmission lines using on-chip termination (OCT) circuits to reduce the number of external components and to conserve board area.

On-chip termination circuits can be implemented with on-chip termination resistors. However, the impedance of on-chip resistors varies as the temperature of the integrated circuit changes. Also, process variations between integrated circuit die can cause on-chip resistors to have different impedances. When the impedance of an on-chip termination circuit is not equal to the characteristic impedance of the transmission line, signal reflection typically increases, causing increased signal distortion.

Because un-calibrated on-chip termination circuits can have impedances with undesirably large tolerance ranges, calibration circuits are often used to improve the accuracy of an on-chip termination (OCT) circuit. However, many prior art on-chip termination calibration circuits do not provide a high enough accuracy for some applications. Therefore, it would be desirable to provide on-chip termination calibration circuits that can provide highly accurate on-chip termination impedances.

BRIEF SUMMARY OF THE INVENTION

The present invention provides techniques for calibrating on-chip termination circuits. A calibration circuit block includes a first resistor network, a second resistor network, and a feedback loop. The first resistor network includes a set of transistors and receives a constant current from a constant current source. The second resistor network receives a tracking current from a tracking current source. The impedance of the second resistor network changes with temperature and process variations on the integrated circuit. The tracking current source compensates for variations in the impedance of the second resistor network that are caused by process and temperature variations to maintain a constant reference voltage at the second resistor network.

The feedback loop generates calibration control signals for controlling the conductive states of the transistors in the first resistor network. The feedback loop adjusts the calibration control signals to maintain a constant impedance in the first resistor network. The calibration control signals also calibrate the impedance of an on-chip termination circuit to match the characteristic impedance of a transmission line.

Other objects, features, and advantages of the present invention will become apparent upon consideration of the following detailed description and the accompanying drawings.

DETAILED DESCRIPTION OF THE INVENTION

Figure 1A:
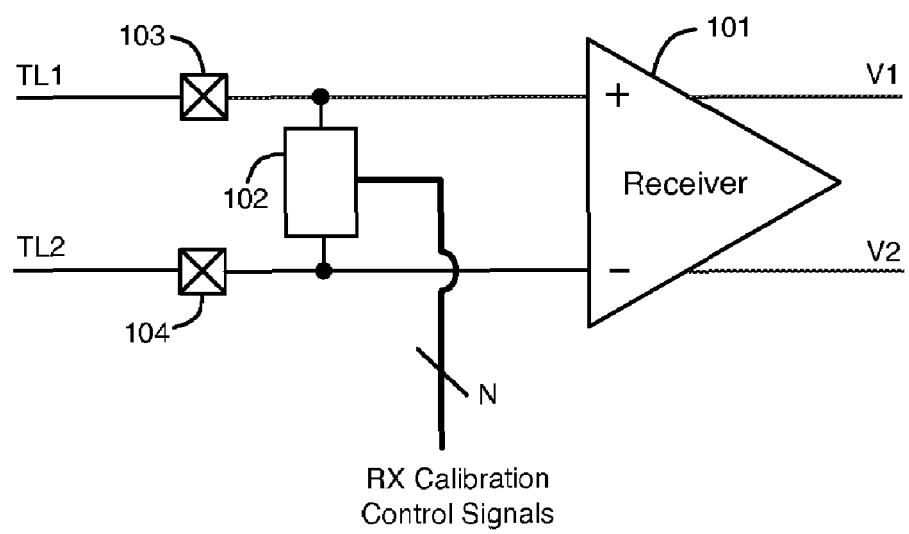
FIG. 1A is a diagram of a calibrated on-chip termination (OCT) circuit coupled between two input pins and two differential input terminals of a receiver, according to an embodiment of the present invention.

FIG. 1A illustrates a receiver buffer 101 and a receiver on-chip termination (OCT) circuit 102, according to an embodiment of the present invention. Receiver buffer 101 and receiver OCT circuit 102 are located on an integrated circuit die. Differential signals are transmitted from a transmitter (not shown) through transmission lines TL1 and TL2 to differential input pins 103 and 104, respectively. Receiver 101 has plus and minus inputs that are coupled to pins 103 and 104, respectively, to receive the differential input signals from transmission lines TL1 and TL2. Receiver 101 generates differential output signals V1 and V2.

Receiver OCT circuit 102 is coupled between pins 103 and 104. OCT circuit 102 provides a matching termination impedance to transmission lines TL1 and TL2 to prevent signal reflection from receiver 101. OCT circuit 102 includes one or more resistors and one or more pass gates. An N number of receiver (RX) calibration control signals control the conductive states of the pass gates to calibrate the impedance of OCT circuit 102. The RX calibration control signals are adjusted so that the impedance of OCT circuit 102 remains constant.

Figure 1B:
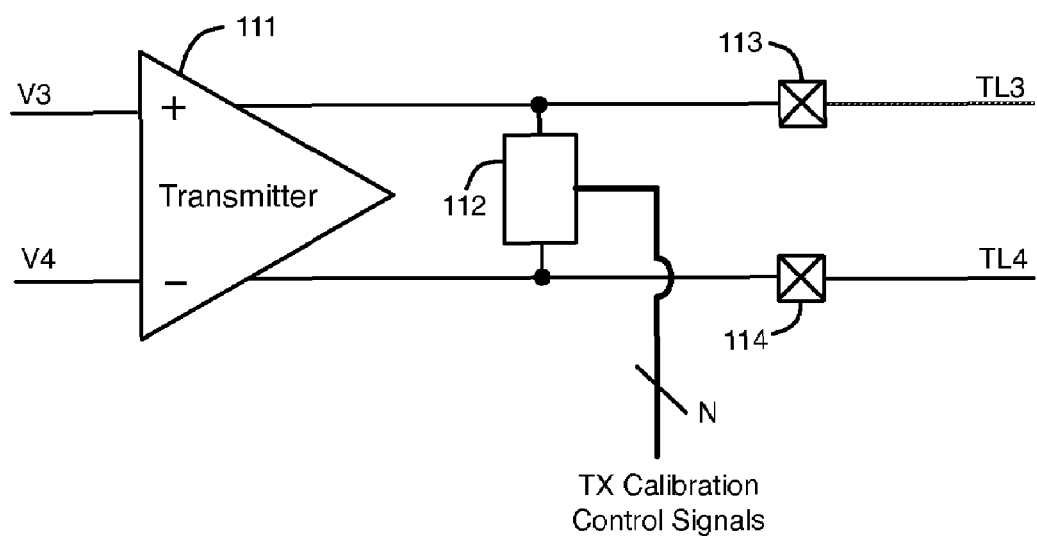
FIG. 1B is a diagram of a calibrated on-chip termination (OCT) circuit coupled between two output pins and two differential output terminals of a transmitter, according to an embodiment of the present invention.

FIG. 1B illustrates a transmitter buffer 111 and a transmitter on-chip termination (OCT) circuit 112, according to an embodiment of the present invention. Transmitter buffer 111 and transmitter OCT circuit 112 are located on an integrated circuit die. Transmitter buffer 111 receives differential input signals V3 and V4 at its plus and minus inputs. The differential outputs of transmitter 111 are coupled to output pins 113 and 114. Transmitter 111 transmits differential output signals to transmission lines TL3 and TL4 through differential output pins 113 and 114, respectively.

Transmitter OCT circuit 112 is coupled between pins 113 and 114. OCT circuit 112 provides a matching termination impedance to transmission lines TL3 and TL4 to prevent signal reflection from transmitter 111. OCT circuit 112 includes one or more resistors and one or more pass gates. An N number of transmitter (TX) calibration control signals control the conductive states of the pass gates to calibrate the impedance of OCT circuit 112. The TX calibration control signals are adjusted so that the impedance of OCT circuit 112 remains constant.

Figure 2:
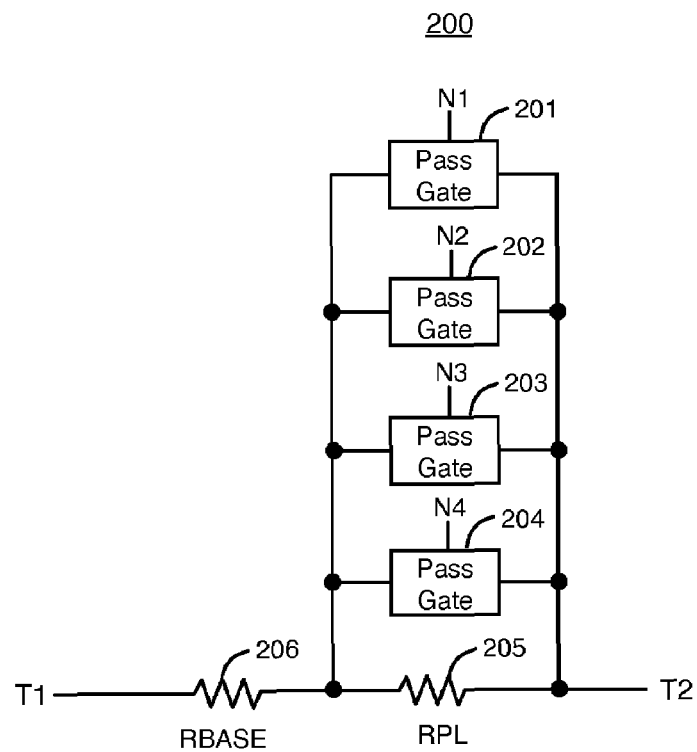
FIG. 2 is a diagram of a calibrated on-chip termination (OCT) circuit, according to an embodiment of the present invention.

FIG. 2 is a diagram of an on-chip termination (OCT) circuit 200 that can be calibrated according to embodiments of the present invention. OCT circuit 200 includes a parallel resistor (RPL) 205 and a base resistor (RBASE) 206 that are coupled in series between terminals T1 and T2. Resistors 205 and 206 can be, for example, non-silicided polysilicon resistors. OCT circuit 200 also includes four CMOS pass gates 201-204 coupled together in parallel with resistor 205. Each of the pass gates typically includes an n-channel MOS field-effect transistor and a p-channel MOS field-effect transistor coupled in parallel. The transistors in pass gates 201-204 can have different channel width-to-length ratios. OCT circuit 200 is an example of OCT circuits 102 and 112.

Pass gates 201-204 receive calibration control signals N1-N4 at respective input terminals. The logic states of calibration control signals N1-N4 determine the conductive states of the transistors in pass gates 201-204. The logic states of calibration control signals N1-N4 can be adjusted to achieve a desired impedance for circuit 200. For example, one or more of pass gates 201-204 can be turned on to reduce the net resistance between terminals T1 and T2 to a matching impedance value. When all of pass gates 201-204 are on, the resistance of circuit 200 is minimized.

An OCT circuit of the present invention can have more than 4 pass gates to increase the accuracy of the termination impedance. However, each additional pass gate that is added to the OCT circuit increases the load capacitance at the input/output pins, because the transistors in the pass gates have capacitance. OCT circuit 200 achieves a balance between termination impedance accuracy and load capacitance by having only 4 pass gates.

Figure 3A:
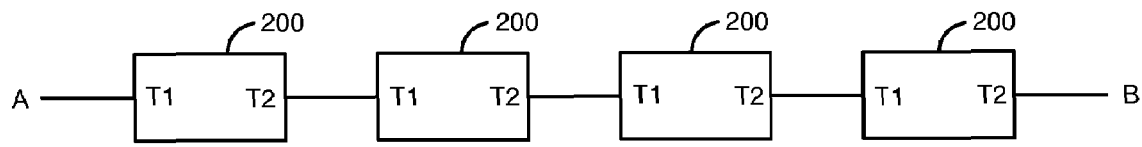
FIG. 3A is a diagram that illustrates a configuration of four OCT circuits coupled together in series, according to an embodiment of the present invention.
Figure 3B:
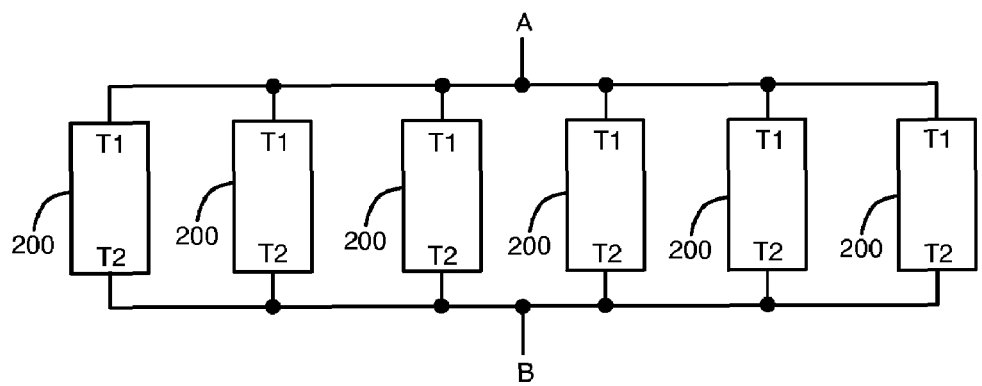
FIG. 3B is a diagram that illustrates a configuration of six OCT circuits coupled together in parallel, according to an embodiment of the present invention.

FIG. 3A is a diagram that illustrates a configuration of four of the OCT circuits 200 of FIG. 2 coupled together in series at their T1 and T2 terminals between terminals A and B, according to a particular embodiment of the present invention. FIG. 3B is a diagram that illustrates a configuration of six of the OCT circuits 200 of FIG. 2 coupled together in parallel at their T1 and T2 terminals between terminals A and B, according to another embodiment of the present invention. The OCT circuit configurations shown in FIGS. 3A and 3B illustrate two more examples of OCT circuits 102 and 112 of FIGS. 1A-1B. The configurations of FIGS. 2, 3A, and 3B are merely examples and are not intended to limit of the scope of the present invention. The principles of the present invention can be applied to numerous other configurations of OCT circuits.

Figure 4:
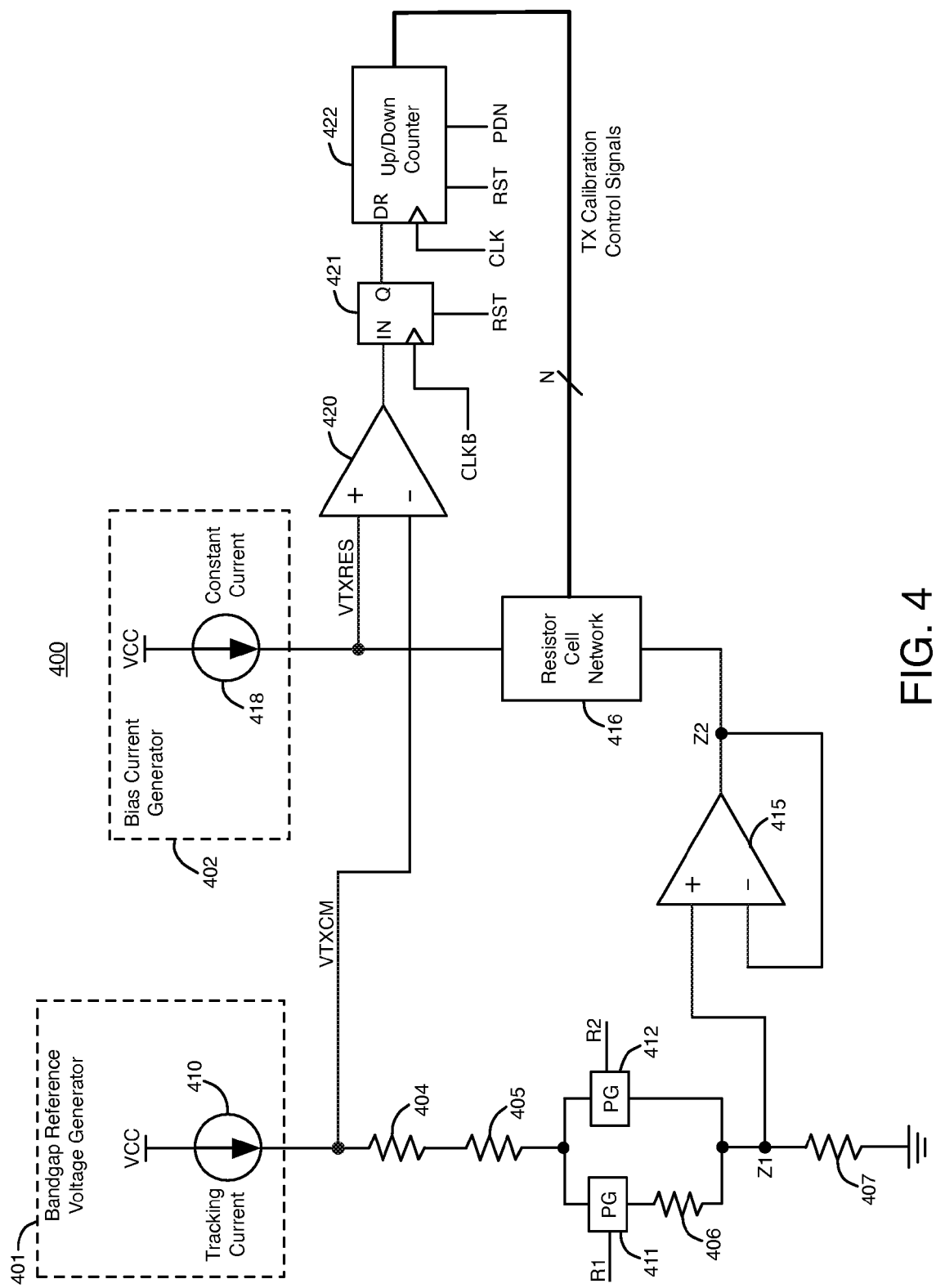
FIG. 4 is a diagram of a calibration circuit block used to calibrate on-chip termination (OCT) circuits for transmitters, according to an embodiment of the present invention.

FIG. 4 is a diagram of a calibration circuit block 400 that calibrates on-chip termination impedances for transmitters, according to an embodiment of the present invention. Calibration circuit block 400 generates an N number of transmitter (TX) calibration control signals that are used to calibrate the termination impedance of one or more transmitter on-chip termination (OCT) circuits. For example, calibration circuit 400 can generate N transmitter (TX) calibration control signals for calibrating the termination impedance of OCT circuit 112. FIG. 2 illustrates an example of how 4 TX calibration control signals N1-N4 can control the conductive states of the transistors in a calibrated OCT circuit.

Voltage VTXCM in FIG. 4 equals the common mode voltage of the transmitter 111 that is coupled to calibrated OCT circuit 112. Calibration circuit block 400 includes resistors 404-407, pass gates 411-412, a tracking current source 410, constant current source 418, operational amplifier 415, resistor cell network 416, comparator 420, flip-flop 421, and up/down counter 422. Calibration circuit block 400 uses the voltage between voltage VTXCM and node Z1 as a reference value to calibrate the impedance of transmitter on-chip termination circuit 112 and other transmitter OCT circuits.

Resistor 405 is coupled to two CMOS pass gates 411-412. Each of the pass gates typically includes an n-channel MOS field-effect transistor and a p-channel MOS field-effect transistor coupled in parallel. Pass gates 411-412 function as electrical switches. Pass gate 411 is in a high impedance state when it is off and a low impedance state when it is on. Also, pass gate 412 is in a high impedance state when it is off and a low impedance state when it is on. Pass gates 411 and 412 are coupled to receive CRAM control signals R1 and R2, respectively. Control signals R1 and R2 can turn pass gates 411 and 412 on or off to vary the voltage VTXCM and the resistance between VTXCM and node Z1.

A systematic offset in transmitter 111 can cause the termination impedance seen by transmission lines TL3 and TL4 to be different than the actual impedance of OCT circuit 112. Pass gates 411-412 cause the voltage difference between VTXCM and node Z1 to change, which in turn causes the termination impedance of OCT circuit 112 to vary in order to compensate for any systematic offsets in transmitter 111.

For example, in a typical configuration, pass gates 411 is off, blocking current through resistor 406, and pass gate 412 is on. Pass gate 411 can be turned on, and pass gate 412 can be turned off to couple resistor 406 in series with resistors 404-405. Turning on pass gate 411 and turning off pass gate 412 increases the voltage drop and the total resistance between VTXCM and node Z1, which causes the resistor network 416 to calibrate to a slightly different impedance using the feedback loop described below.

Bandgap reference voltage generator 401 generates a reference voltage that remains substantially constant over temperature and that is proportional to a silicon bandgap voltage. Bandgap reference voltage source 401 can be located inside or outside calibration block 400. Bandgap reference voltage generator 401 generates a tracking current (e.g., 50 microamps) from a tracking current source 410 that is biased by a temperature independent reference voltage.

Process and temperature variations on the integrated circuit die can cause the resistances of resistors 404-407 to vary. Tracking current source 410 generates a tracking current. Tracking current source 410 varies the tracking current to compensate for variations in the resistances of resistors 404-407 that are caused by process and temperature variations on the integrated circuit. The tracking current is inversely proportional to variations in the resistances of resistors 404-407 that are caused by process and temperature variations, such that the common mode voltage VTXCM remains substantially constant over process and temperature variations.

For example, if changes in the temperature of the integrated circuit cause the resistances of resistors 404-407 to decrease, tracking current source 410 increases the tracking current by an amount that maintains a constant voltage VTXCM, according to Ohm's law (V=IR). As another example, if changes in the temperature of the integrated circuit cause the resistances of resistors 404-407 to increase, tracking current source 410 decreases the tracking current by an amount that maintains a constant voltage VTXCM. Thus, the resistances of resistors 404-407 and the current through resistors 404-407 track each other.

Resistor cell network 416 includes one or more resistors and one or more pass gates. Resistor cell network 416 typically has an identical circuit architecture as the OCT circuits that calibration block 400 controls. For example, if the N transmitter calibration control signals generated by calibration block 400 are used to control the impedance of OCT circuit 112, then resistor cell network 416 and OCT circuit 112 have the same circuit architecture. FIGS. 2, 3A and 3B illustrate examples of resistor cell network 416 (and corresponding transmitter OCT circuits). Resistor cell network 416 can include multiple OCT circuits 200 coupled together in parallel or in series, as shown in FIGS. 3A-3B. The techniques of the present invention can also be used with numerous other configurations of resistor cell network 416.

A constant current source 418 generates a constant current (e.g., 500 microamps) in resistor cell network 416. Constant current source 418 generates a constant current that remains the same current value over process and temperature variations on the integrated circuit. Constant current source 418 is located in a bias current generator 402, as shown in FIG. 4. The bias current generator can include a cascoded current mirror configuration that is used to reduce current variations caused by changes in the output voltages. The current mirror in bias current generator 402 can use a constant current from bandgap reference voltage generator 401 to generate constant current source 418.

Resistor cell network 416 is coupled to an output and an inverting input of operational amplifier 415 at node Z2. The non-inverting input of operational amplifier 415 is coupled to node Z1 between resistors 406 and 407. The voltage at node Z1 is referenced to ground. Operational amplifier 415 is implemented in a voltage follower configuration to clamp the voltage at node Z2 to be substantially equal to the voltage at node Z1. Thus, when voltage VTXCM equals voltage VTXRES, the voltage drop from voltage VTXCM to node Z1 equals the voltage drop from voltage VTXRES to node Z2.

Comparator 420 compares voltages VTXCM and VTXRES to generate a digital output signal that is transmitted to the input terminal of flip-flop 421. Flip-flop 421 is clocked by an inverted clock signal CLKB. Flip-flop 421 can be, e.g., a D flip-flop.

Flip-flop 421 stores the output state of comparator 420 at its Q output for one clock cycle of CLKB. The output signal of flip-flop 421 is transmitted to the directional DR input of up/down counter 422. Up/down counter 422 is clocked by clock signal CLK. CLKB is inverted with respect to CLK. Up/down counter 422 generates an N number of TX calibration control signals. The TX calibration control signals are transmitted to control inputs of resistor cell network 416 and control inputs of one or more transmitter OCT circuits (e.g., OCT circuit 112).

When VTXRES is greater than VTXCM, the output signal of comparator 420 is a logic high. After flip-flop 421 stores the logic high at its Q output, up/down counter 422 increases the binary value of the N TX calibration control signals to decrease the impedance of resistor cell network 416. When the VTXRES is less than VTXCM, the output signal of comparator 420 is a logic low. After flip-flop 421 stores the logic low at its Q output, up/down counter 422 decreases the binary value of the N TX calibration control signals to increase the impedance of resistor cell network 416. After each change in the logic states of the TX calibration control signals, comparator 420 compares the new value of voltage VTXRES with voltage VTXCM, and the calibration process continues. The feedback loop formed by comparator 420, flip-flop 421, and up/down counter 422 continues to adjust the TX calibration control signals to minimize the voltage difference between VTXRES and VTXCM.

Because resistor cell network 416 is implemented using resistors and pass gates, the resistance of resistor cell network 416 varies with process and temperature. The feedback loop turns on appropriate pass gates in network 416 to make the resistance of network 416 constant, e.g., 50 Ohms, under all conditions. For example, under one process or temperature, the TX calibration control signal settings that generate 50 Ohms is 0010, and under another process or temperature, the TX calibration control signal settings that generate 50 Ohms is 1011. For each of the calibration control signal settings generated by the feedback loop, the resistance of network 416 and OCT circuit 112 remains at 50 Ohms.

Tracking current source 410 significantly improves the accuracy of transmitter OCT circuit 112, because it maintains a constant common mode voltage VTXCM over process and temperature variations on the integrated circuit. Because voltage VTXCM is constant, calibration circuit block 400 can generate TX calibration control signals that cause OCT circuit 112 to have an impedance that is substantially equal to the characteristic impedance of the transmission lines (plus or minus any offsets). Tracking current source 410 prevents variations in the resistances of resistors 404-407 that are caused by temperature or process variations from effecting the accuracy of the termination impedance of OCT circuit 112.

Figure 5:
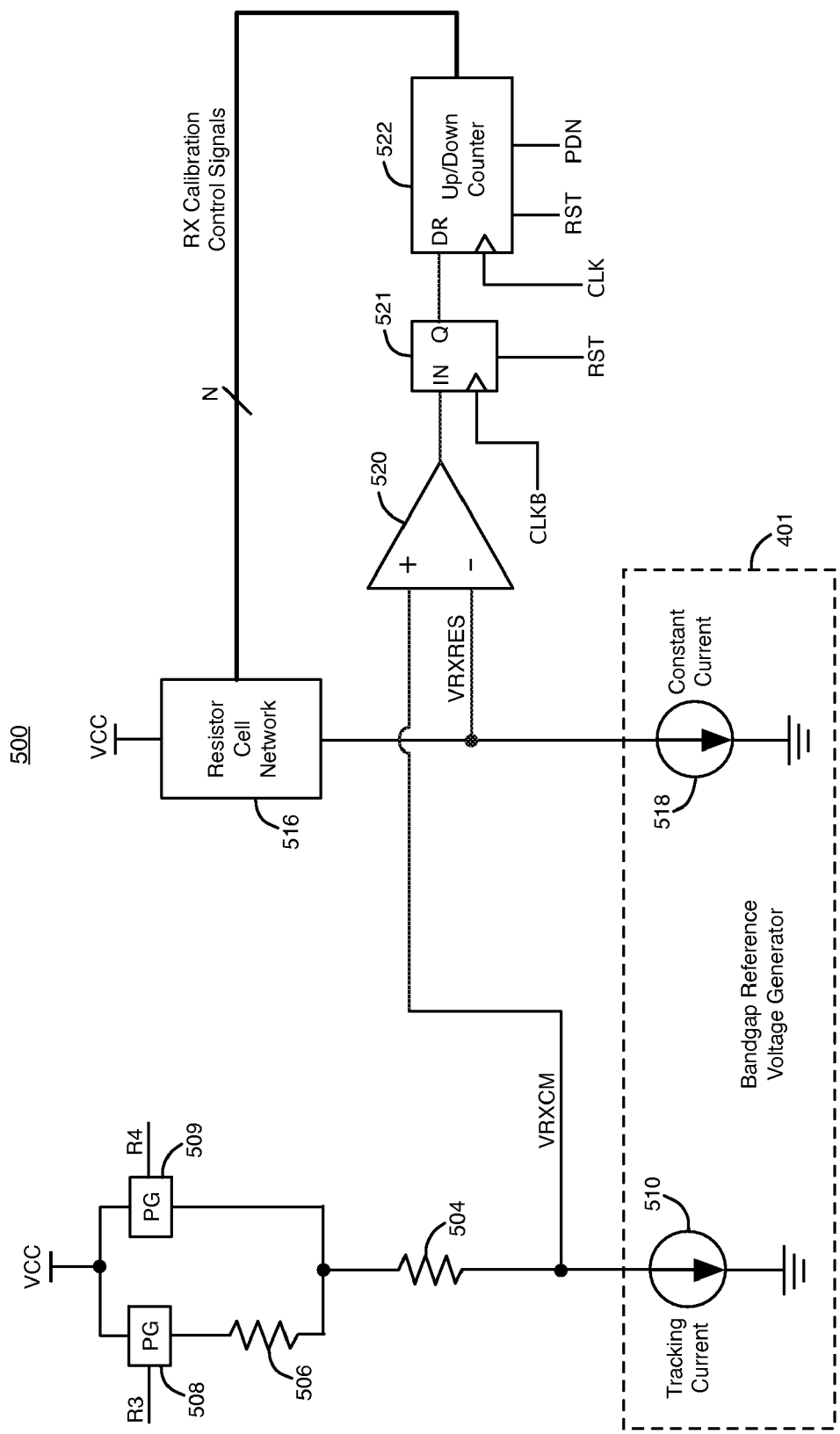
FIG. 5 is a diagram of a calibration circuit block used to calibrate on-chip termination (OCT) circuits for receivers, according to an embodiment of the present invention.

FIG. 5 is a diagram of a calibration circuit block 500 that calibrates on-chip termination impedances for receivers, according to another embodiment of the present invention. Calibration circuit block 500 generates an N number of receiver (RX) calibration control signals that are used to calibrate the termination impedance of one or more receiver on-chip termination (OCT) circuits. For example, calibration circuit 500 can generate an N number of receiver calibration control signals for calibrating the termination impedance of OCT circuit 102. FIG. 2 illustrates an example of how 4 receiver (RX) calibration control signals N1-N4 can control the conductive states of transistors in a calibrated OCT circuit.

Voltage VRXCM in FIG. 5 equals the common mode voltage of the receiver 101 that is coupled to OCT circuit 102. Voltage VRXCM is typically different than voltage VTXCM. Calibration circuit block 500 includes resistors 504 and 506, pass gates 508-509, tracking current source 510, constant current source 518, resistor cell network 516, comparator 520, flip-flop 521, and up/down counter 522. Calibration circuit block 500 uses the voltage between supply voltage VCC and voltage VRXCM as a reference value to calibrate the termination impedance of OCT circuit 102 and other receiver OCT circuits.

Pass gates 508-509 function as electrical switches. Pass gate 508 is in a high impedance state when it is off and a low impedance state when it is on. Pass gate 509 is in a high impedance state when it is off and a low impedance state when it is on. Pass gates 508 and 509 are coupled to receive CRAM control signals R3 and R4, respectively. Control signals R3 and R4 can turn on a different one of the pass gates 508 and 509 to vary the voltage VRXCM and the resistance between VCC and VRXCM.

A systematic offset in receiver 101 can cause the termination impedance seen by transmission lines TL1 and TL2 to be different than the actual impedance of OCT circuit 102. Pass gates 508-509 cause the voltage difference between VCC and VRXCM to change, which in turn causes the termination impedance of OCT circuit 102 to vary in order to compensate for any systematic offsets in receiver 101.

For example, in a typical configuration, pass gate 508 is off, blocking current through resistor 506, and pass gate 509 is on. Pass gate 508 can be turned on, and pass gate 509 can be turned off to couple resistor 506 in series with resistor 504. Turning on pass gate 508 and turning off pass gate 509 increases the voltage drop and the total resistance between VCC and VRXCM, which causes the resistor network 516 to calibrate to a slightly different impedance using the feedback loop described below.

Process and temperature variations on the integrated circuit die can cause the resistances of resistors 504 and 506 to vary. Bandgap reference voltage generator 401 has a second tracking current source 510 that generates a tracking current. Tracking current source 510 varies the tracking current to compensate for variations in the resistances of resistors 504 and 506 that are caused by temperature and process variations on the integrated circuit. The tracking current is inversely proportional to variations in the resistances of resistors 504 and 506 that are caused by temperature and process variations, such that the common mode voltage VRXCM remains substantially constant over process and temperature variations. Tracking current source 510 can generate the tracking current using a temperature independent reference voltage from bandgap reference voltage generator 401.

For example, if changes in the temperature of the integrated circuit cause the resistances of resistors 504 and 506 to decrease, tracking current source 510 increases the tracking current by an amount that maintains a constant voltage VRXCM, according to Ohm's law (V=IR). As another example, if changes in the temperature of the integrated circuit cause the resistances of resistors 504 and 506 to increase, tracking current source 510 decreases the tracking current by an amount that maintains a constant voltage VRXCM. Thus, the resistances of resistors 504 and 506 and the current through resistors 504 and 506 track each other.

Resistor cell network 516 includes one or more resistors and one or more pass gates. Resistor cell network 516 typically has an identical circuit architecture as the OCT circuits that calibration block 500 controls. For example, if the N receiver calibration control signals generated by calibration block 500 are used to control the impedance of OCT circuit 102, then resistor cell network 516 and OCT circuit 102 have the same circuit architecture. FIGS. 2, 3A and 3B illustrate examples of resistor cell network 516 (and corresponding receiver OCT circuits). Resistor cell network 516 can include multiple OCT circuits 200 coupled together in parallel or in series, as shown in FIGS. 3A-3B. The techniques of the present invention can also be used with numerous other configurations of resistor cell network 516.

One terminal of resistor cell network 516 is coupled to supply voltage VCC. Because resistor cell network 516 is referenced to VCC, calibration circuit block 500 does not need an operational amplifier. A second terminal of resistor cell network 516 is coupled to a constant current source 518 that generates a constant current. Constant current source 518 comes from bandgap reference voltage generator 401. Constant current source 518 generates a constant current that remains the same current value over process and temperature variations on the integrated circuit. Constant current source 518 functions as a current sink in block 500. The current in resistor cell network 516 equals the constant current generated by constant current source 518.

Comparator 520 compares voltages VRXCM and VRXRES to generate a digital output signal that is transmitted to the input terminal of flip-flop 521. Flip-flop 521 is clocked by an inverted clock signal CLKB. Flip-flop 521 can be, e.g., a D flip-flop. Flip-flop 521 stores the output state of comparator 520 at its Q output for one clock cycle of CLKB.

The output of flip-flop 521 is transmitted to the directional DR input of up/down counter 522. Up/down counter 522 is clocked by a clock signal CLK. CLKB is inverted with respect to CLK. Up/down counter 522 generates an N number of RX calibration control signals. The RX calibration control signals are transmitted to control inputs of resistor cell network 516 and to control inputs of one or more receiver OCT circuits (e.g., OCT circuit 102).

When VRXRES is less than VRXCM, the output signal of comparator 520 is a logic high. After flip-flop 521 stores the logic high at its Q output, up/down counter 522 increases the binary value of the N RX calibration control signals to decrease the impedance of resistor cell network 516. When the VRXRES is greater than VTXCM, the output signal of comparator 520 is a logic low. After flip-flop 521 stores the logic low at its Q output, up/down counter 522 decreases the binary value of the N RX calibration control signals to increase the impedance of resistor cell network 516.

After each change in the logic states of the RX calibration control signals, comparator 520 compares the new value of voltage VRXRES with voltage VRXCM, and the calibration process continues. The feedback loop formed by comparator 520, flip-flop 521, and up/down counter 522 continues to adjust the RX calibration control signals to minimize the voltage difference between VRXRES and VRXCM.

Because resistor cell network 516 is implemented using resistors and pass gates, the resistance of resistor cell network 516 varies with process and temperature. The feedback loop turns on appropriate pass gates in network 516 to make the resistance of network 516 constant, e.g., 50 Ohms, under all conditions. For example, under one process or temperature, the RX calibration control signal settings that generate 50 Ohms is 0010, and under another process or temperature, the RX calibration control signal settings that generate 50 Ohms is 1011. For each of the calibration control signal settings generated by the feedback loop, the resistance of network 516 and OCT circuit 102 remains at 50 Ohms.

Tracking current source 510 significantly improves the accuracy of receiver OCT circuit 102, because it maintains a constant common mode voltage VRXCM over temperature and process variations on the integrated circuit. Because voltage VRXCM is constant, calibration circuit block 500 can generate RX calibration control signals that cause OCT circuit 102 to have an impedance that is substantially equal to the characteristic impedance of the transmission lines (plus or minus any intended offsets). Tracking current source 510 prevents variations in the resistances of resistors 504 and 506 that are caused by temperature or process variations from effecting the accuracy of the termination impedance of OCT circuit 102.

Figure 6:
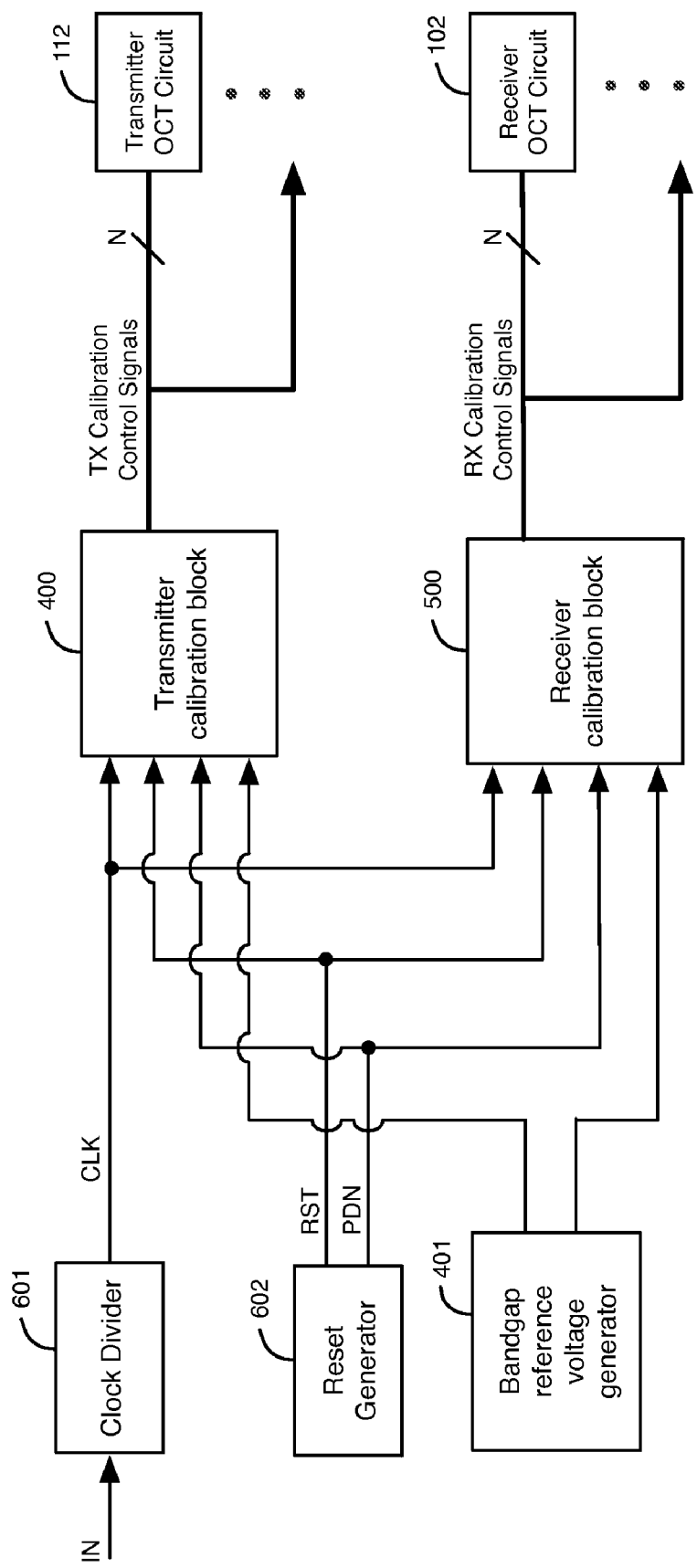
FIG. 6 illustrates additional circuit blocks that are coupled to the calibration circuit blocks, according to an embodiment of the present invention.

FIG. 6 illustrates additional circuit blocks that are coupled to the calibration circuit blocks, according to an embodiment of the present invention. Transmitter calibration circuit block 400 and receiver calibration circuit block 500 each receive a clock signal CLK from a clock divider circuit 601. Clock divider circuit 601 can be, for example, a counter circuit. Clock divider circuit 601 receives an input clock signal IN from a phase-locked loop, a delay-locked loop, or from off-chip.

Clock divider 601 divides the frequency of clock signal IN to generate a clock signal CLK that has a slower frequency. For example, clock divider 601 can include 6 divide-by-2 flip-flops that are cascaded together to reduce the frequency of IN by a factor of 64. In this example, divider 601 divides the frequency of IN by 64 to generate CLK. It is desirable to generate a slower clock signal for driving circuits in calibration blocks 400 and 500, because a slower clock signal reduces the speed requirements of the comparator, flip-flop, and up/down counter circuits in the calibration blocks. CLK can be inverted inside the calibration blocks to generate CLKB.

Reset generator 602 in FIG. 6 generates a reset signal RST and a power down signal PDN. The RST signal is provided to inputs of flips-flops 421 and 521 as well as the flip-flops in up/down counters 422 and 522 as shown in FIGS. 4-5. The reset signal RST resets the output signals of the flip-flops in calibration circuit blocks 400 and 500 to zero.

The power down signal PDN is provided to inputs of up/down counters 422 and 522 as shown in FIGS. 4-5. When the PDN signal is asserted, the up/down counters 422 and 522 hold the states of the TX/RX calibration control signals constant. When the PDN signal is de-asserted, up/down counters 422 and 522 increase or decrease the binary values of the TX/RX calibration control signals in response to the logic states of the output signals of flip-flops 421/521.

According to an embodiment of the present invention, calibration circuit blocks 400 and 500 can function in two different modes of operation. The two modes of operation are calibration-once mode and continuous calibration mode. In continuous calibration mode, the power down signal PDN is always de-asserted, and the calibration signals change continuously. In continuous calibration mode, the calibration control signals are constantly updated.

The transistors inside the pass gates in OCT circuits 102 and 112 generate capacitive coupling at the input and output pins. Because of this capacitive coupling, the switching of the transistors in OCT circuits 102 and 112 injects jitter into the input and output signals at the input and output pins. Jitter tends to degrade circuit performance. Also, the switching of the states of the signals at the pins is capacitively coupled onto the calibration control signals.

In calibration-once mode, the power down signal PDN is de-asserted for 512 clock cycles. After the 512 clock cycles, PDN is asserted. Once the power down signal PDN is asserted, calibration is completed, and the states of the RX and TX calibration control signals remain unchanged. Once the RX and TX signals remain constant, the amount of jitter that is injected into the input and output signals from the OCT circuits is significantly reduced, and the OCT circuits maintain their calibrated impedance values. To further reduce jitter injection at the pins caused by the calibration control signals, the techniques of slew rate reduction on bit drivers and staggered drivers can be employed.

The default operating mode of the calibration circuit blocks is calibration-once mode. Reset generator 602 contains a finite state machine (FSM) that controls the timing of the reset signal RST and the power down signal PDN based on the selected mode of operation.

FIG. 6 also illustrates bandgap reference voltage generator 401 that is located outside the calibration circuit blocks in this example. Bandgap reference voltage generator 401 transmits tracking currents to calibration circuit blocks 400 and 500 and a constant current to block 500, as described above.

Calibration circuit block 400 transmits N transmitter (TX) calibration control signals to OCT circuit 112 and other transmitter OCT circuits on the integrated circuit. Calibration circuit block 500 transmits N receiver (RX) calibration control signals to OCT circuit 102 and other receiver OCT circuits on the integrated circuit.

Calibration blocks 400 and 500 are designed to calibrate termination impedances on high speed transmitter and receiver pins. The calibration blocks are able to calibrate both transmitter and receiver termination impedances, e.g., to about 50 ohms, in a wide range of operating conditions. The feedback loops adjust the RX and TX calibration control signals automatically to provide an optimal impedance setting.

Figure 7:
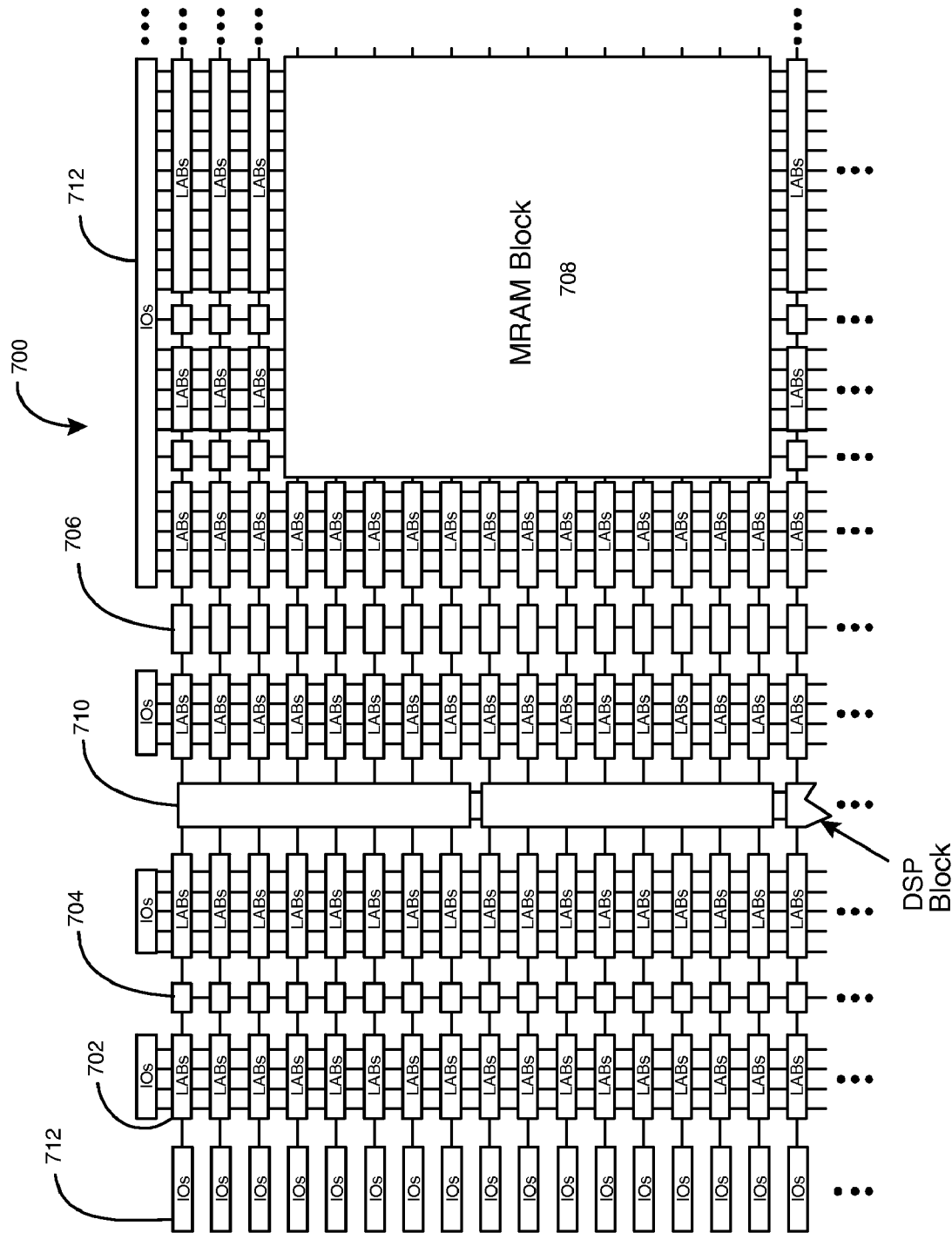
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
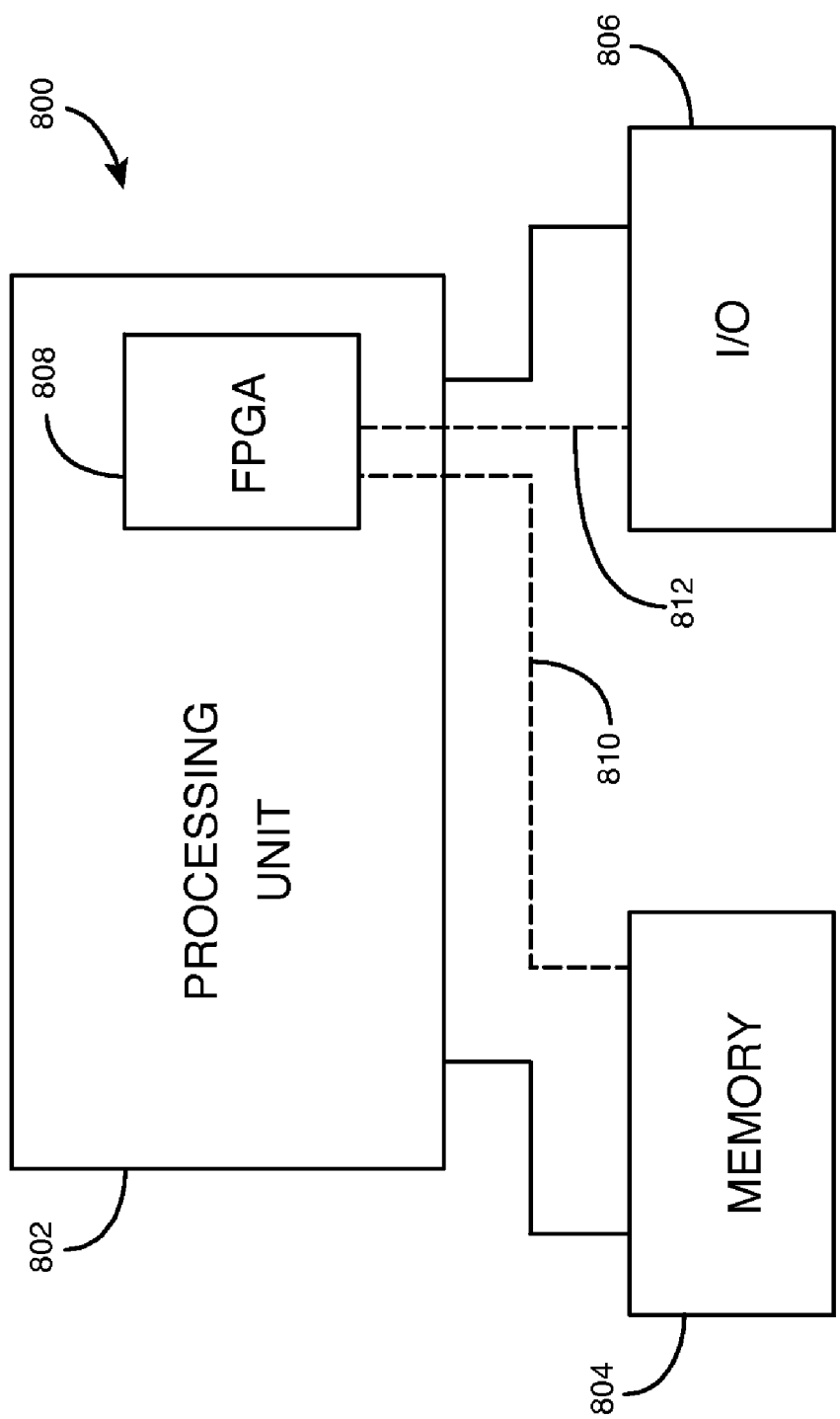
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. An on-chip termination calibration circuit comprising:
   a first resistor network comprising a first resistor and a plurality of transistors;
   a constant current source coupled to the first resistor network;
   a second resistor network comprising a second resistor, wherein the second resistor network receives a tracking current from a tracking current source that maintains a voltage at a terminal of the second resistor network substantially constant over temperature and process variations; and
   a feedback loop circuit having a first input coupled to the first resistor network and a second input coupled to the second resistor network, wherein the feedback loop generates calibration control signals that control conductive states of the plurality of transistors.

2. The on-chip termination calibration circuit defined in claim 1 wherein the tracking current source is located in a bandgap reference voltage generator.

3. The on-chip termination calibration circuit defined in claim 1 wherein the feedback loop circuit comprises a comparator having a first input coupled to receive a first signal from the first resistor network and a second input coupled to receive a second signal from the second resistor network.

4. The on-chip termination calibration circuit defined in claim 3 wherein the feedback loop circuit further comprises a counter circuit that generates the calibration control signals.

5. The on-chip termination calibration circuit defined in claim 4 wherein the feedback loop further comprises a flip-flop coupled to an output of the comparator and an input of the counter circuit.

6. The on-chip termination calibration circuit defined in claim 1 wherein the calibration control signals are used to control an on-chip termination impedance of a third resistor network coupled to a buffer and a pin of an integrated circuit.

7. The on-chip termination calibration circuit defined in claim 1 further comprising:
   an operational amplifier coupled to the first and the second resistor networks.

8. The on-chip termination calibration circuit defined in claim 1 wherein the first resistor network comprises pass gates that are coupled in parallel with the first resistor.

9. The on-chip termination calibration circuit defined in claim 1 wherein the on-chip calibration circuit is on a programmable logic integrated circuit.

10. The on-chip termination calibration circuit defined in claim 1 wherein the second resistor network comprises a pass gates and a third resistor, and the pass gate is turned on to increase the resistance of the second resistor network.

11. A method for calibrating an on-chip termination circuit on an integrated circuit, the method comprising:
   providing a first constant current through a first resistor network using a constant current source, wherein the first resistor network comprises a plurality of transistors;
   varying a second current through a second resistor network to maintain a voltage at the second resistor network substantially constant over temperature and process variations on the integrated circuit; and
   varying conductive states of the plurality of transistors in the first resistor network using calibration control signals that are generated by a feedback loop circuit, wherein the feedback loop circuit receives a first signal from the first resistor network and a second signal from the second resistor network.

12. The method defined in claim 11 wherein the first resistor network comprises a plurality of resistors.

13. The method defined in claim 11 wherein the integrated circuit is a field programmable gate array.

14. The method defined in claim 11 wherein varying the conductive states of the plurality of transistors in the first resistor network using the calibration control signals further comprises comparing the first signal from the first resistor network to the second signal from the second resistor network using a comparator.

15. The method defined in claim 14 wherein varying the conductive states of the plurality of transistors in the first resistor network using the calibration control signals further comprises generating the calibration control signals using a counter circuit that varies the calibration control signals in response to an output signal of the comparator.

16. The method defined in claim 11 further comprising:
clamping a voltage in the first resistor network to be substantially equal to a voltage in the second resistor network using an operational amplifier.

17. The method defined in claim 11 wherein varying the second current through the second resistor network to maintain the voltage at the second resistor network substantially constant over temperature and process variations on the integrated circuit further comprises generating a tracking current using a tracking current source in a bandgap reference voltage generator.

18. An integrated circuit comprising an on-chip termination calibration circuit, the on-chip termination calibration circuit comprising:
a first resistor network comprising a first plurality of pass gates, wherein a constant current is provided to a terminal of the first resistor network;
a second resistor network that receives a tracking current, wherein the tracking current maintains a voltage at a terminal of the second resistor network substantially constant over temperature and process variations on the integrated circuit; and
means for generating calibration control signals that control conductive states of the first plurality of pass gates, wherein the means for generating the calibration control signals is coupled to the first and the second resistor networks.

19. The integrated circuit defined in claim 18 further comprising a buffer and a third resistor network that is coupled to a pin, wherein the third resistor network comprises a second plurality of pass gates, and conductive states of the second plurality of pass gates is controlled by the calibration control signals.

20. The integrated circuit defined in claim 18 wherein the integrated circuit is a programmable logic device.

* * * * *